(12) United States Patent
Kim et al.

(10) Patent No.: US 11,328,637 B2
(45) Date of Patent: May 10, 2022

(54) INSPECTING DEVICE OF DISPLAY PANEL AND INSPECTING METHOD OF DISPLAY PANEL USING THE SAME

(71) Applicant: Samsung Display Co., Ltd., Yongin-si (KR)

(72) Inventors: Dae Hong Kim, Seongnam-si (KR); Hyungjin Lee, Suwon-si (KR); Sung Hoon Yang, Seoul (KR); Se Yoon Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 286 days.

(21) Appl. No.: 16/593,402

(22) Filed: Oct. 4, 2019

(65) Prior Publication Data
US 2020/0135073 A1    Apr. 30, 2020

(30) Foreign Application Priority Data
Oct. 26, 2018    (KR) .................. 10-2018-0128641

(51) Int. Cl.
*G06K 9/00*    (2006.01)
*G09G 3/00*    (2006.01)
(Continued)

(52) U.S. Cl.
CPC .......... *G09G 3/006* (2013.01); *G01R 19/0053* (2013.01); *G01R 31/2806* (2013.01);
(Continued)

(58) Field of Classification Search
CPC .......... G09G 3/006; G06T 7/0004; G06T 7/70; G06T 2207/30121; G01R 31/2806;
(Continued)

(56) References Cited

U.S. PATENT DOCUMENTS

| | | | | |
|---|---|---|---|---|
| 7,253,645 | B2 * | 8/2007 | Talbot | G06T 7/0004 324/754.22 |
| 7,385,195 | B2 * | 6/2008 | Yamada | G01R 31/307 250/307 |

(Continued)

FOREIGN PATENT DOCUMENTS

| | | | |
|---|---|---|---|
| JP | 09061458 | A * | 3/1997 |
| KR | 10-0449515 | B1 | 11/2004 |

(Continued)

*Primary Examiner* — Mahendra R Patel
(74) *Attorney, Agent, or Firm* — Lewis Roca Rothgerber Christie LLP

(57) ABSTRACT

An inspecting device of a display panel includes a contact including first probe pins that contact to data pads of a display panel and second probe pins that contact to common voltage pads of the display panel, a signal generator coupled to the first probe pins, the signal generator configured to generate a first data voltage corresponding to a first gray level and a second data voltage corresponding to a second gray level, a power generator coupled to the second probe pins, the power generator configured to generate a first common voltage and a second common voltage of which a voltage level is different from a voltage level of the second common voltage, and a defect detector configured to detect a defect of the display panel by removing a contact noise generated due to contact failure of the first probe pins and the second probe pins.

20 Claims, 8 Drawing Sheets

(51) Int. Cl.
  *G06T 7/00* (2017.01)
  *G01R 31/28* (2006.01)
  *G01R 19/00* (2006.01)
  *G06T 7/70* (2017.01)
(52) U.S. Cl.
  CPC .............. *G06T 7/0004* (2013.01); *G06T 7/70* (2017.01); *G06T 2207/30121* (2013.01)
(58) Field of Classification Search
  CPC . G01R 19/0053; G01R 31/3183; H01J 37/28; H01J 2237/292; H01J 2237/2817; H01J 2237/221
  USPC ......................................................... 382/141
  See application file for complete search history.

(56) References Cited

U.S. PATENT DOCUMENTS

| | | | | |
|---|---|---|---|---|
| 7,602,199 | B2 * | 10/2009 | Johnston | G01R 31/2808 324/760.02 |
| 2004/0207836 | A1 * | 10/2004 | Chhibber | G01N 21/9501 356/237.4 |
| 2007/0120789 | A1 * | 5/2007 | Lee | G09G 3/3648 345/87 |
| 2008/0088336 | A1 * | 4/2008 | Pommerenke | G09G 3/006 324/754.21 |
| 2009/0105967 | A1 * | 4/2009 | Hatanaka | G01N 29/0618 702/39 |
| 2010/0177313 | A1 * | 7/2010 | Jun | G09G 3/006 356/366 |
| 2010/0303334 | A1 * | 12/2010 | Kitamura | G06K 9/48 382/141 |
| 2015/0097592 | A1 * | 4/2015 | Lee | G09G 3/006 324/760.02 |
| 2017/0064297 | A1 * | 3/2017 | Kim | G09G 3/006 |

FOREIGN PATENT DOCUMENTS

| | | | | |
|---|---|---|---|---|
| KR | 100449515 | B1 * | 11/2004 | |
| KR | 20090054093 | A * | 5/2009 | |
| KR | 20160007409 | A * | 1/2016 | ........ H01J 37/32532 |
| KR | 101601903 | B1 * | 3/2016 | |

* cited by examiner

INSPECTING DEVICE OF DISPLAY PANEL AND INSPECTING METHOD OF DISPLAY PANEL USING THE SAME

CROSS-REFERENCE TO RELATED APPLICATION

This application claims priority to and the benefit of Korean Patent Application No. 10-2018-0128641, filed on Oct. 26, 2018 in the Korean Intellectual Property Office (KIPO), the content of which is incorporated herein in its entirety by reference.

BACKGROUND

1. Field

Example embodiments relate generally to an inspecting device for a display panel and an inspecting method for a display panel utilizing the same.

2. Description of the Related Art

When a display device is manufactured, various inspections are conducted to detect defects in the products. The defects may be detected by applying a test signal to the display panel utilizing a probe and checking for a short or an open state between gate lines, data lines and pixels of the display panel. Here, contact noise may be generated due to contact (e.g., contact failure) of the probes and/or the like, so that the defect of the display panel may not be accurately detected.

SUMMARY

An aspect according to some example embodiments is directed toward an inspecting device for a display panel (e.g., a display panel inspecting device) capable of accurately detecting defects of the display panel.

Another aspect according to some example embodiments is directed toward an inspecting method for a display panel (e.g., a display panel inspecting method) capable of accurately detecting defects of the display panel.

According to an example embodiment, an inspecting device for a display panel may include a contact including first probe pins configured to contact data pads of a display panel and second probe pins configured to contact common voltage pads of the display panel, a signal generator coupled to the first probe pins, the signal generator configured to generate a first data voltage corresponding to a first gray level and a second data voltage corresponding to a second gray level, a power generator coupled to the second probe pins, the power generator configured to generate a first common voltage and a second common voltage of which its voltage level is different than that of the first common voltage, and a defect detector configured to detect a defect of the display panel by removing (e.g., compensating for) a contact noise generated due to contact failure of the first probe pins and the second probe pins.

In example embodiments, the defect detector may be configured to detect the defect of the display panel based on a first inspection image detected when the first data voltage and the first common voltage are provided to the display panel through the contact, a second inspection image detected when the first data voltage and the second common voltage are provided to the display panel through the contact, and a third inspection image detected when the second data voltage and the first common voltage are provided to the display panel through the contact.

In example embodiments, the first inspection image may include the defect of the display panel and the contact noise, and the second inspection image may include the defect of the display panel without the contact noise.

In example embodiments, the defect detector may be configured to detect positions and luminance of the defect of the display panel and the contact noise based on the first inspection image, and detect the position of the defect of the display panel based on the second inspection image.

In example embodiments, the defect detector may be configured to detect a position and luminance of the contact noise included in the first inspection image based on the first inspection image and the second inspection image, and generate a compensation data that is configured to compensate for the contact noise.

In example embodiments, the detection detector may be configured to provide the compensation data to the signal generator, and the signal generator may be configured to generate the second data voltage corresponding to the second gray level based on the compensation data.

In example embodiments, the defect detector may be configured to detect the defect of the display panel based on the third inspection image.

In example embodiments, the defect detector may include a vision camera configured to image the display panel and obtain the first inspection image, the second inspection image, and the third inspection image, a first defect detector configured to detect a position and luminance of the contact noise based on the first inspection image and the second inspection image, generate a compensation data configured to compensate for the contact noise, and output the compensation data to the signal generator, and a second defect detector configured to detect the defect of the display panel based on the third inspection image.

In some example embodiments, the first data voltage may be configured to swing between a first voltage level and a second voltage level lower than the first voltage level, the first common voltage may be a voltage level between the first voltage level and the second voltage level, and the second common voltage may be a voltage level higher than the first voltage level.

In some example embodiments, a difference of the voltage level of the second common voltage and the first voltage level of the first data voltage may be greater than or the same as a difference of the first voltage level of the first data voltage and the voltage level of the first common voltage.

In some example embodiments, when the display panel is a normal black panel, the first gray level is a maximum gray level value and the second gray level may have a gray level value lower than the gray level value of the first gray level.

In some example embodiments, when the display panel is a normal white panel, the first gray level is a minimum gray level value and the second gray level may have a gray level value higher than the gray level value of the first gray level.

According to an example embodiment, an inspecting method for a display panel may include providing a first data voltage corresponding to a first gray level to data pads of a display panel through first probe pins and providing a first common voltage to common voltage pads of the display panel through second probe pins, obtaining a first inspection image by imaging the display panel, providing the first data voltage to the data pads through the first probe pins and providing a second common voltage of which its voltage level is different than that of the first common voltage to the common voltage pads through the second probe pins, obtaining a second inspection image by imaging the display panel, detecting a position and luminance of a contact noise generated due to a contact failure of the first probe pins and the second probe pins based on the first inspection image and the second inspection image, generating a compensation data configured to compensate the luminance of the contact noise, providing a second data voltage corresponding to a second gray level to the data pads through the first probe pins and providing the first common voltage to the common voltage pads through the second probe pins, wherein the second data voltage is generated based on the compensation data, obtaining a third inspection image by imaging the display panel, and detecting a defect of the display panel based on the third inspection image.

In example embodiments, the first data voltage may be configured to swing between a first voltage level and a second voltage level lower than the first voltage level.

In example embodiments, the first common voltage may be a voltage level between the first voltage level and the second voltage level.

In example embodiments, the second common voltage may be higher in voltage level than the first voltage level.

In example embodiments, a difference between the voltage level of the second common voltage and the first voltage level of the first data voltage may be greater than or the same as a difference between the first voltage level of the first data voltage and the voltage level of the first common voltage.

In example embodiments, when the display panel is a normal black panel, the first gray level may be a maximum gray level value and the second gray level may have a gray level value lower than the gray level value of the first gray level.

In example embodiments, when the display panel is a normal white panel, the first gray level may be a minimum gray level value and the second gray level may have a gray level value higher than the gray level value of the first gray level.

In example embodiments, the first inspection image may include the defect of the display panel and the contact noise, and the second inspection image may include the defect of the display panel without the contact noise.

According to embodiments of the present disclosure, the inspecting device for the display panel and the inspecting method for the display panel may detect the contact noise by changing the voltage level of its common voltage (e.g., change from the first common voltage to the second common voltage) provided to the common voltage pads in the display panel and compensate for the contact noise by generating the compensating data. Thus, the inspecting device for the display panel and the inspecting method for the display panel may accurately detect the defect of the display panel.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Hereinafter, the present inventive concept will be explained in more detail with reference to the accompanying drawings.

Figure 1:
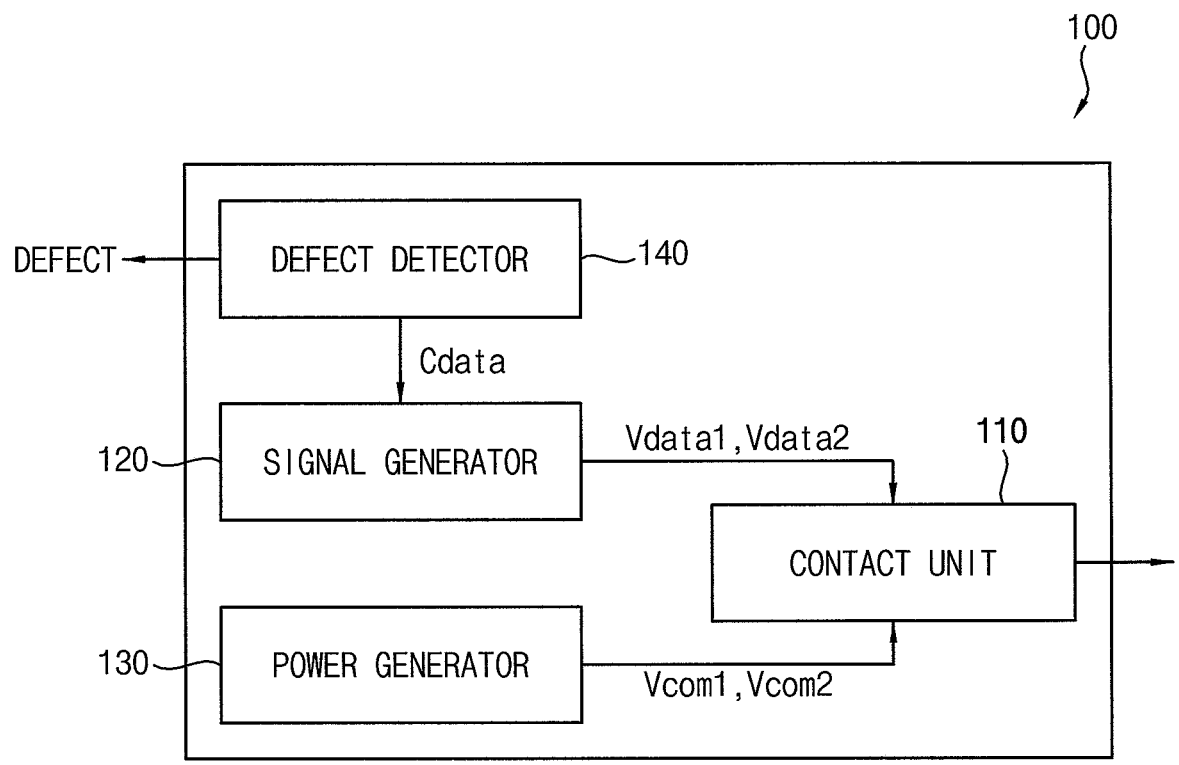
FIG. 1 is a block diagram illustrating an inspecting device for a display panel according to example embodiments.
Figure 2:
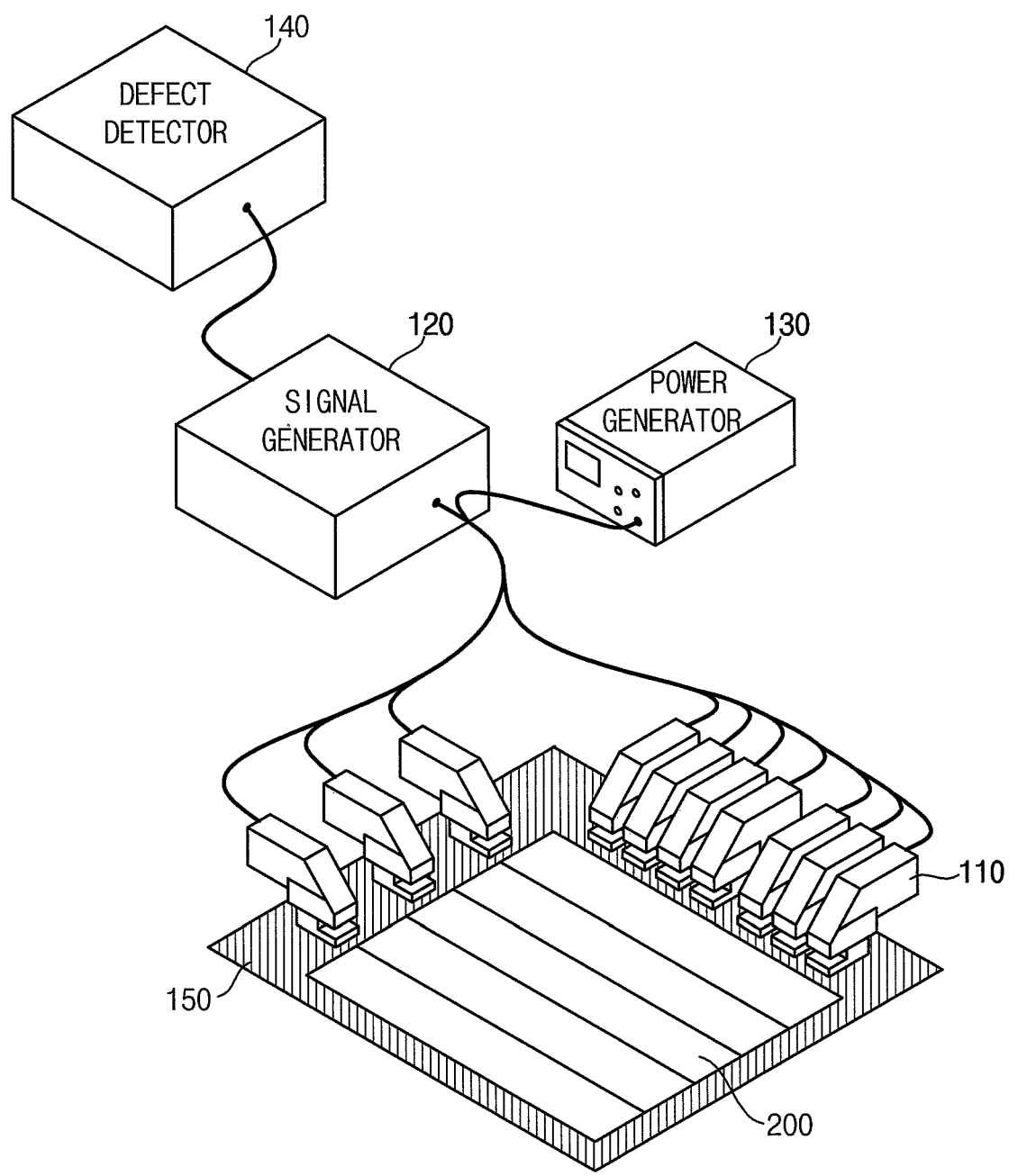
FIG. 2 is a diagram illustrating a process of detecting defect of the display panel utilizing the inspecting device of FIG. 1.
Figure 3:
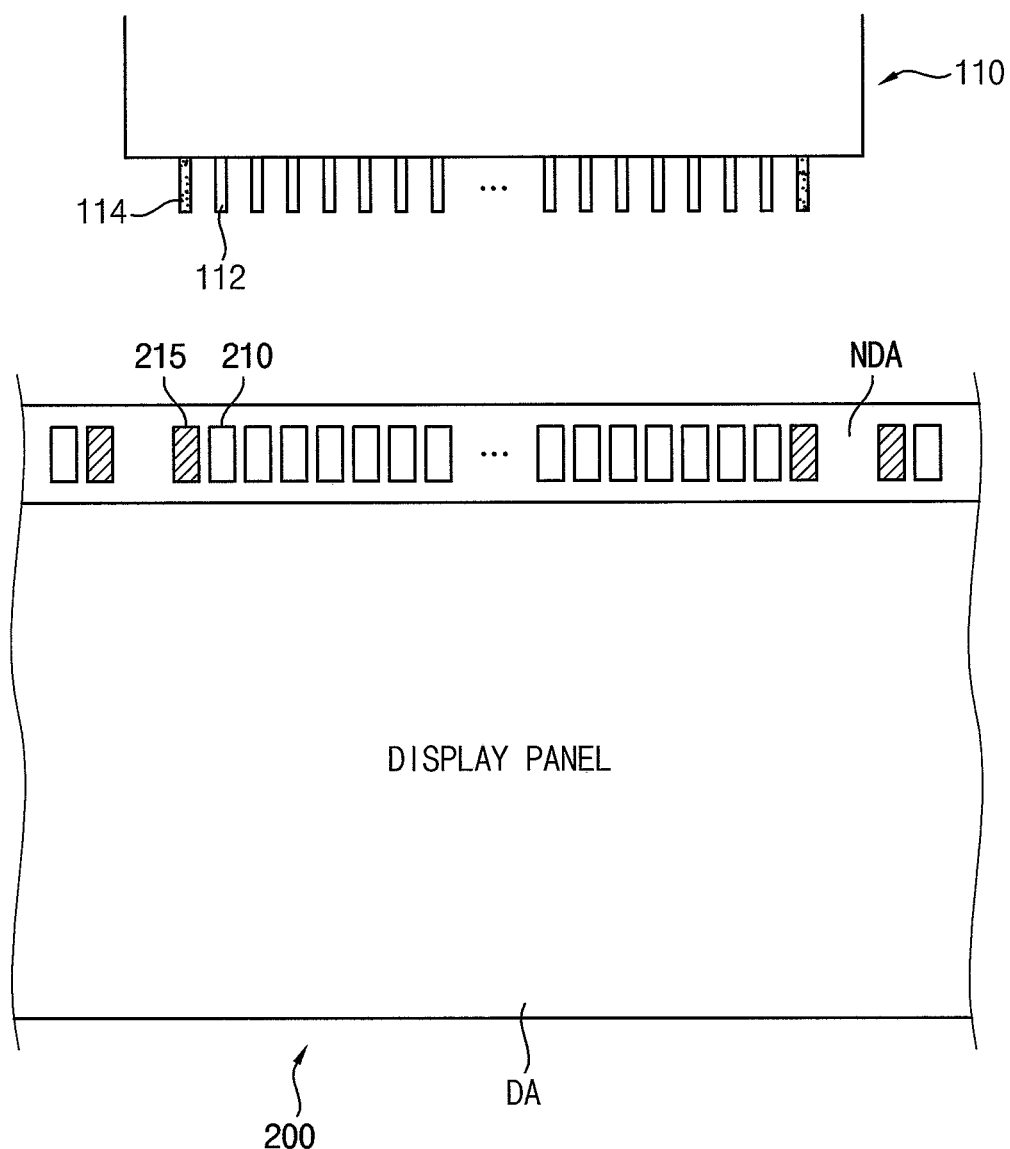
FIG. 3 is a diagram illustrating a contact included in the inspecting device of FIG. 1 and the display panel of FIG. 2.

FIG. 1 is a block diagram illustrating an inspecting device for a display panel according to example embodiments. FIG. 2 is a diagram illustrating a process of detecting defect of the display panel utilizing the inspecting device of FIG. 1. FIG. 3 is a diagram illustrating a contact included in the inspecting device of FIG. 1 and the display panel of FIG. 2.

Referring to FIGS. 1 and 2, an inspecting device 100 of a display panel may include a contact (e.g., a contact part, or a contact unit) 110, a signal generator 120, a power generator 130, and a defect detector 140. A display panel 200 may be disposed on a stage 150 in a manufacturing process (e.g., a visual inspecting process) of the display panel 200 as shown in FIG. 2. The inspecting device 100 may contact the display panel 200 disposed on the stage 150 through the contact 110. The inspecting device 100 may provide a driving signal (e.g., a gate signal, a data signal, etc.) and a driving voltage (e.g., a power voltage, a common voltage, etc.) to the display panel 200 through the contact 110 and detect a defect of the display panel 200 by analyzing an image displayed on the display panel 200.

The display panel 200 may include data lines, gate lines, and a plurality of pixels. The pixels may be formed in intersection or crossing regions of the data lines and the gate lines. In some example embodiments, each of the pixels may include a thin film transistor electrically coupled to the gate line and the data line, and a liquid crystal capacitor and a storage capacitor coupled to the thin film transistor. In some embodiments, the display panel 200 may be a liquid crystal display panel.

Referring to FIG. 3, the display panel 200 may include a display area DA and a non-display area NDA. The data lines, the gates lines, and the pixels may be formed in the display area DA. Pads, e.g., data pads 210 coupled to the data lines, gate pads coupled to the gate lines, power pads coupled to the power lines, common voltage pads 215 coupled to the common voltage lines, etc., may be formed in the non-display area NDA. The power line and the common voltage line may include at least one line. Alternatively, the power line and the common voltage line may include at least one face (e.g., a planar shape). Alternatively, the power line and the common voltage line may be formed in a mesh shape. The pads may be coupled to a gate integrated circuit (IC) and a data integrated circuit after the inspecting process. For example, the gate integrated circuit and the data integrated circuit may be formed in a driving chip and be mounted on the pads in the non-display area NDA as a chip on glass (COG). Alternatively, the gate integrated circuit and the data integrated circuit may be formed in the driving chip, mounted on a flexible printed circuit board (FPCB) as a chip on film (COF), and coupled to the pads in the non-display area NDA through the flexible printed circuit board.

Referring to FIG. 3, the contact 110 may include first probe pins 112 and second probe pins 114. In an inspecting process of the display panel 200, the first probe pins 112 of the contact 110 may contact with the data pads 210 of the display panel 200 and the second probe pins 114 of the contact 110 may contact with the common voltage pads 215.

The signal generator 120 may be coupled to the first probe pins 112 of the contact 110. The signal generator 120 may generate a first data voltage Vdata1 corresponding to a first gray level (e.g., a first grayscale value) and a second data voltage Vdata2 corresponding to a second gray level (e.g., a second grayscale value). For example, when the data voltage corresponding to the first gray level is provided to the display panel 200, it is easy to detect a line defect and when the data voltage corresponding to the second gray level is provided to the display panel 200, it is easy to detect the line defect, a pixel defect, a stain defect, etc.

The liquid crystal display device may be classified into a twisted nematic (TN) mode, a vertical alignment (VA) mode, an in plane switching (IPS) mode, a fringe field switching (FFS) mode, etc., according to a method of adjusting an arrangement of the liquid crystal layer. The display panel 200 may be classified into a normal black panel or a normal white panel according to a color of the display panel 200 when the driving signal and the driving voltage are not provided to the display panel 200. For example, the twisted nematic mode liquid crystal display device may be a normal white device because the color of the display panel 200 is white (transparent) when the driving signal and the driving voltage are not provided. The vertical alignment mode liquid crystal display device may be a normal black device because the color of the display panel 200 is black (non-transparent) when the driving signal and the driving voltage are not provided.

In some example embodiments, when the display panel 200 is the normal black panel, the first gray level may be a maximum gray level value. For example, when the liquid crystal display device is driven in 8-bit, the first gray level may correspond to 255 gray level (e.g., may have a gray level value of 255). That is, when the display panel 200 is the normal black panel, the signal generator 120 may provide the first data voltage Vdata1 corresponding to the 255 gray level to the display panel 200. The display panel 200 may display a white color image based on the first data voltage Vdata1. The second gray level may have a gray level value lower than the gray level value of the first gray level (i.e., the maximum gray level value). For example, the signal generator 120 may provide the second data voltage Vdata2 corresponding to 125 gray level (e.g., may have a gray level value of 125) to the display panel 200. The display panel 200 may display a gray color image based on the second data voltage Vdata2.

In other example embodiments, when the display panel 200 is the normal white panel, the first gray level may be a minimum gray level value. For example, when the liquid crystal display device is driven in 8-bit, the first gray level may correspond to 0 gray level (e.g., may have a gray level value of 0). That is, when the display panel 200 is the normal white panel, the signal generator 120 may provide the first data voltage Vdata1 corresponding to the 0 gray level to the display panel 200. The display panel 200 may display a black color image based on the first data voltage Vdata1. The second gray level may have a gray level value higher than the gray level value of the first gray level (i.e., the minimum gray level value). For example, the signal generator 120 may provide the second data voltage Vdata2 corresponding to 125 gray level (e.g., may have a gray level value of 125) to the display panel 200. The display panel 200 may display a gray color image based on the second data voltage Vdata2.

The power generator 130 may be coupled to the second probe pins 114 and generate a first common voltage Vcom1 and a second common voltage Vcom2. When the first data voltage Vdata1 generated in the signal generator 120 swings (e.g., switches periodically) between a first voltage level and a second voltage level lower than the first voltage level, the first common voltage Vcom1 may be a voltage level between the first voltage level and the second voltage level. Further, when the first data voltage Vdata1 swings between the first voltage level and the second voltage level lower than the first voltage level, the second common voltage Vcom2 may be a voltage level higher than the first voltage level. Here, a difference between the voltage level of the second common voltage Vcom2 and the first voltage level of the first data voltage Vdata1 may be greater than or the same as a difference between the first voltage level of the first data voltage Vdata1 and the voltage level of the first common voltage Vcom1.

The defect detector 140 may detect defect of the display panel 200 by removing a contact noise generated due to a contact failure of the first probe pins 112 and the second probe pins 114. The defect detector 140 may detect a first inspection image when the first data voltage Vdata1 and the first common voltage Vcom1 are provided to the display panel 200 through the contact 110. The defect detector 140 may detect a second inspection image when the first data voltage Vdata1 and the second common voltage Vcom2 are provided to the display panel 200 through the contact 110. The defect detector 140 may detect a third inspection image when the second data voltage Vdata2 and the first common voltage Vcom1 are provided to the display panel 200 through the contact 110. The defect detector 140 may detect the defect of the display panel 200 based on the first inspection image, the second inspection image, and the third inspection image.

When the first data voltage Vdata1 and the first common voltage Vcom1 are provided to the display panel 200, the defect detector 140 may detect the first inspection image that includes the defect of the display panel 200 and the contact noise. The first data voltage Vdata1 may swing between the first voltage level and the second voltage level. The first common voltage Vcom1 may have the voltage level between the first voltage level and the second voltage level. When short circuit occurs between the common voltage line and the data line (i.e., when a potential difference between the common voltage line and the data line does not occur) due to the contact failure of the first probe pins 112 and the second probe pins 114, the contact noise having the same shape (signal) of the line defect of the display panel 200 may occur. The defect detector 140 may detect positions and luminance of the defect of the display panel 200 and the contact noise based on the first inspection image.

When the first data voltage Vdata1 and the second common voltage Vcom2 are provided to the display panel 200, the defect detector 140 may detect the second inspection image that includes the defect of the display panel 200. The second common voltage Vcom2 may have the voltage level higher than the first voltage level. For example, the difference between the voltage level of the second common voltage Vcom2 and the first voltage level of the first data voltage Vdata1 is greater than or the same as the difference between the first voltage level of the first data voltage Vdata1 and the voltage level of the first common voltage Vcom1. When the first data voltage Vdata1 and the second common voltage Vcom2 are provided to the display panel 200 through the first probe pins 112 and the second probe pins 114, the contact noise may not occur even if the contact failure of the first probe pins 112 and the second probe pins 114 may occur because the potential difference exists between the second common voltage Vcom2 provided to the common voltage line and the first data voltage Vdata1 provided to the data line. Thus, the second inspection image may include the defect of the display panel 200 excluding (e.g., without) the contact noise.

The defect detector 140 may detect the position and the luminance of the contact noise included in the first inspection image based on the first inspection image and the second inspection image and generate a compensation data Cdata that compensates the luminance of the contact noise. That is, the defect detector 140 may regard (e.g., identify) a defect occurred in the first inspection image but not in the second inspection image as the contact noise and may detect the position and the luminance of the contact noise in the first inspection image. The defect detector 140 may generate the compensation data Cdata for compensating the luminance of the position where the contact noise occurs. For example, when the luminance of the position where the contact noise occurs is higher than surrounding luminance in the first inspection image, the defect detector 140 may generate the compensation data Cdata so as to lower the luminance of the position where the contact noise is generated. The defect detector 140 may provide the compensation data Cdata to the signal generator 120. The signal generator 120 may generate the second data voltage Vdata2 corresponding to the second gray level based on the compensation data Cdata.

When the second data voltage Vdata2 and the first common voltage Vcom1 are provided to the display panel 200, the defect detector 140 may detect the third inspection image that includes the defect of the display panel 200. The third inspection image may be an image compensated such that the contact noise is equal to the surrounding luminance. The defect of the display panel DEFECT such as the line defect, the pixel defect, the stain defect, etc., may be detected through the third inspection image.

As described above, the inspecting device 100 of the display panel according to example embodiments may accurately detect the defect of the display panel DEFECT by detecting the contact noise by changing the voltage level of the common voltage provided to the common voltage pads 215 in the display panel, generating the compensation data Cdata, and compensating the contact noise.

Figure 4A:
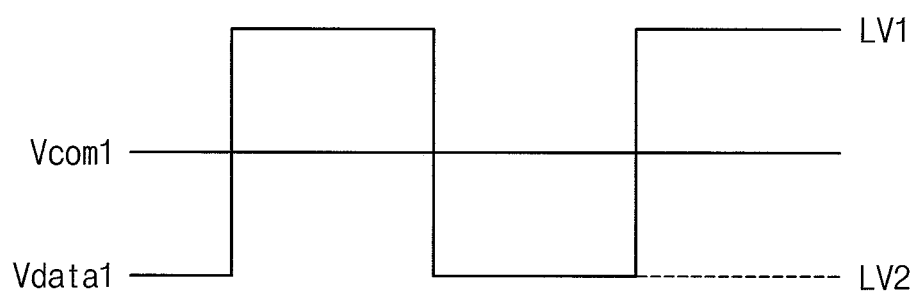
FIGS. 4A through 4C are diagrams illustrating an operation of a signal generator and a power generator included in the inspecting device of FIG. 1.
Figure 4B:
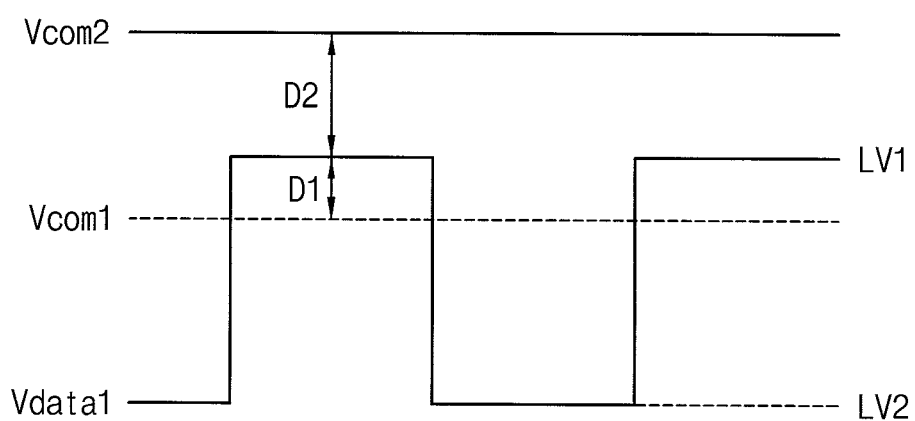
Figure 4C:
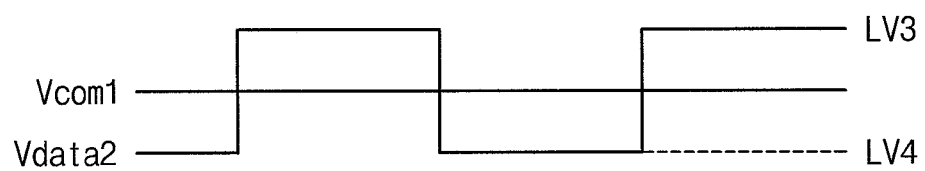
Figure 5A:
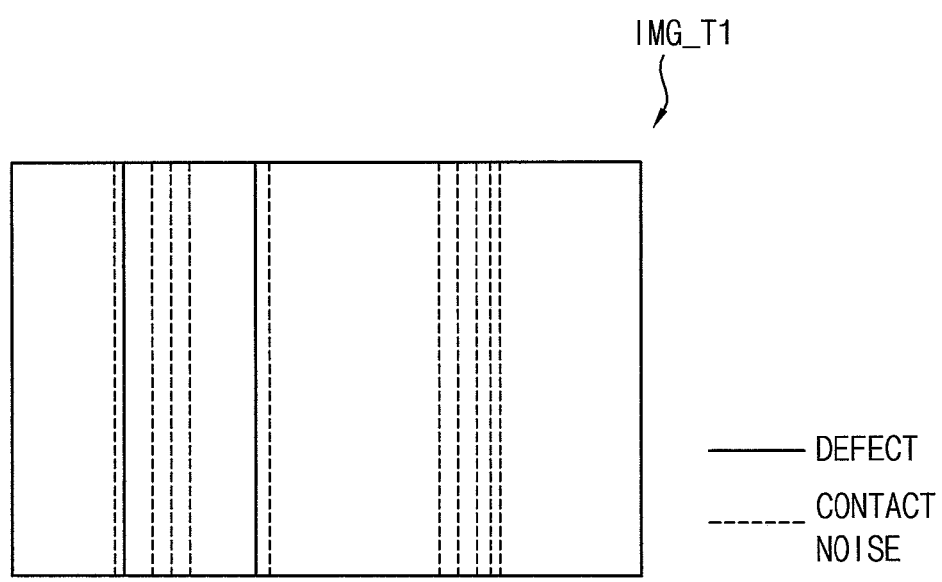
FIGS. 5A through 5C are diagrams illustrating first through third inspection images detected in the defect detector included in the inspecting device of FIG. 1 according to operations of the signal generator and the power generator of FIGS. 4A through 4C for describing an operation of the defect detector of FIG. 1.
Figure 5B:
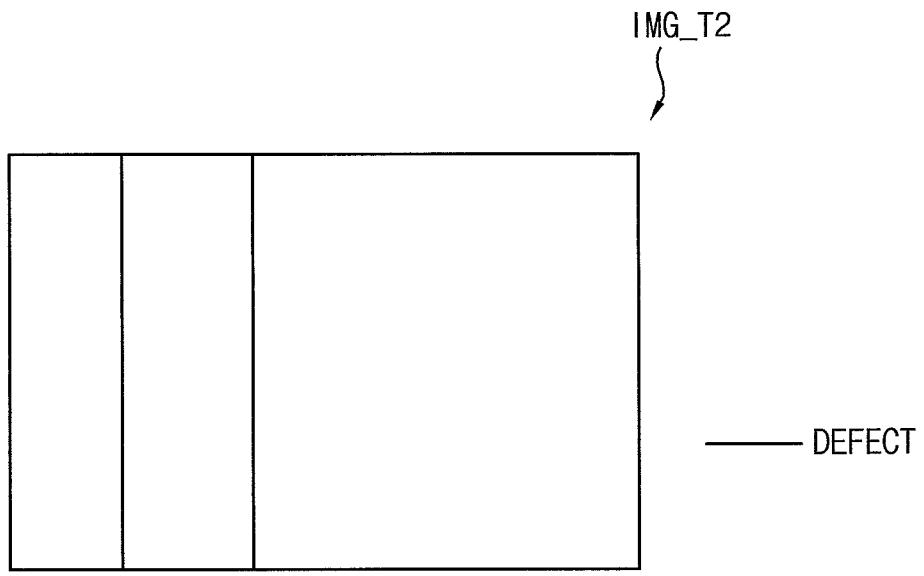
Figure 5C:
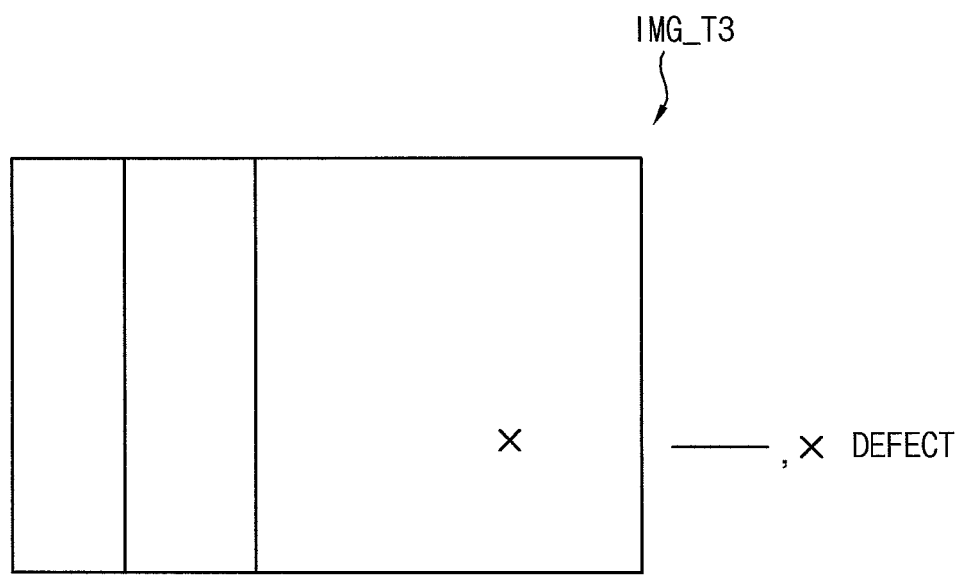

FIGS. 4A through 4C are diagrams illustrating an operation of a signal generator and a power generator included in the inspecting device of FIG. 1. FIGS. 5A through 5C are diagrams illustrating first through third inspection images detected in the defect detector included in the inspecting device of FIG. 1 according to operations of the signal generator and the power generator of FIGS. 4A through 4C for describing an operation of the defect detector of FIG. 1.

Referring to FIG. 4A, the signal generator may generate the first data voltage Vdata1 corresponding to the first gray level. In some example embodiments, when the display panel is the normal black panel, the first gray level may be the maximum gray level value. In other example embodiments, when the display panel is the normal white panel, the first gray level may be the minimum gray level value. The first data voltage Vdata1 may swing between the first voltage level LV1 and the second voltage level LV2. Here, the second voltage level LV2 may be lower than the first voltage level LV1.

The power generator may generate the first common voltage Vcom1. The first common voltage Vcom1 may have the voltage level between the first voltage level LV1 and the second voltage level LV2.

The first data voltage Vdata1 generated from the signal generator may be provided to the data pads in the display panel through the first probe pins of the contact. The first common voltage Vcom1 generated from the power generator may be provided to the common voltage pads in the display panel through the second probe pins of the contact.

When the first data voltage Vdata1 and the first common voltage Vcom1 are provided to the display panel, the defect detector may detect the first inspection image IMG_T1. The first inspection image IMG_T1 may include the defect (DEFECT) of the display panel (e.g., the line defect) and the contact noise (CONTACT NOISE) as shown in FIG. 5A. When the contact of the first probe pins and the second probe pins of the contact to the data pads and the common voltage pads in the display panel is unstable, the contact noise CONTACT NOISE may occur because there is no potential difference between the first data voltage Vdata1 provided to the data line in the display panel and the first common voltage Vcom1 provided to common voltage line in the display panel. Here, a shape of the contact noise CONTACT NOISE may be similar to the defect DEFECT of the display panel.

Referring to FIG. 4B, the signal generator may generate the first data voltage Vdata1 corresponding to the first gray level. In some example embodiments, when the display panel is the normal black panel, the first gray level may be the maximum gray level value. In other example embodiments, when the display panel is the normal white panel, the first gray level may be the minimum gray level value. The first data voltage Vdata1 may swing between the first voltage level LV1 and the second voltage level LV2. Here, the second voltage level LV2 may be lower than the first voltage level LV1.

The power generator may generate the second common voltage Vcom2. The voltage level of the second common voltage Vcom2 may be higher than the first voltage level LV1. Here, the difference D2 between the voltage level of the second common voltage Vcom2 and the first voltage level LV1 of the first data voltage Vdata1 may be greater than or the same as the difference D1 between the first voltage level LV1 of the first data voltage Vdata1 and the voltage level of the first common voltage Vcom1.

The first data voltage Vdata1 generated from the signal generator may be provided to the data pads in the display panel through the first probe pins of the contact. The second common voltage Vcom2 generated from the power generator may be provided to the common voltage pads in the display panel through the second probe pins of the contact.

When the first data voltage Vdata1 and the second common voltage Vcom2 are provided to the display panel, the defect detector may detect the second inspection image IMG_T2. The second inspection image IMG_T2 may include the defect DEFECT of the display panel (e.g., the line defect) as shown in FIG. 5B. When the first data voltage Vdata1 and the second common voltage Vcom2 are provided to the display panel, the potential difference between the first data voltage Vdata1 provided to the data line in the display panel and the second common voltage Vcom2 provided to common voltage line in the display panel may occur although the contact of the first probe pins and the second probe pins of the contact to the data pads and the common voltage pads in the display panel may be unstable. Thus, the contact noise may be removed.

Referring to FIG. 4C, the signal generator may generate the second data voltage Vdata2 corresponding to the second gray level based on the compensating data provided from the defect detector. In some example embodiments, when the display panel is the normal black panel, the second gray level may have the lower gray level value than the first gray level. In other example embodiments, when the display panel is the normal white panel, the second gray level may have the higher gray level value than the first gray level. The second data voltage Vdata2 may swing between the third voltage level LV3 and the fourth voltage level LV4. Here, the third voltage level LV3 may be lower than the first voltage level LV1 and the fourth voltage level LV4 may be higher than the second voltage level LV2.

The power generator may generate the first common voltage Vcom1. The first common voltage Vcom1 may be the same as the first common voltage Vcom1 provided to the display panel in order to detect the first inspection image IMG_T1. The first common voltage Vcom1 may have the voltage level between the third voltage level LV3 and the fourth voltage level LV4.

The second data voltage Vdata2 generated from the signal generator may be provided to the data pads in the display panel through the first probe pins of the contact. The first common voltage Vcom1 generated from the power generator may be provided to the common voltage pads in the display panel through the second probe pins of the contact.

When the second data voltage Vdata2 and the first common voltage Vcom1 are provided to the display panel, the defect detector may detect the third inspection image IMG_T3. The third inspection image IMG_T3 may include the defect DEFECT of the display panel as shown in FIG. 5C. The third inspection image IMG_T3 may include only the defect DEFECT of the display panel although the contact of first probe pins and the second probe pins of the contact to the data pads and the common voltage pads in the display panel may be unstable because the compensation data compensates the luminance of the contact noise. Here, the defect DEFECT of the display panel such as the line defect, the pixel defect, the stain defect, etc., may be detected through the third inspection image IMG_T3 because the second data voltage Vdata2 corresponding to the second gray level is provided to the display panel.

Figure 6:
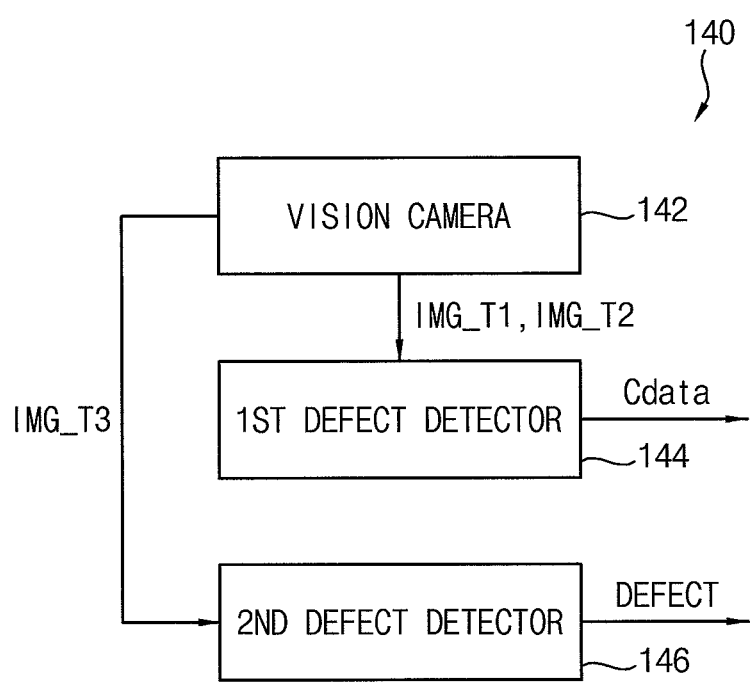
FIG. 6 is a block diagram illustrating a defect detector included in the inspecting device of FIG. 1.

FIG. 6 is a block diagram illustrating a defect detector included in the inspecting device of FIG. 1.

Referring to FIG. 6, the defect detector 140 may include a vision camera 142, a first defect detector 144, and a second defect detector 146.

The vision camera 142 may image (e.g., photograph) the display panel. The vision camera 142 may image the display panel and detect (e.g., obtain) the first inspection image IMG_T1 when the first data voltage and the first common voltage are provided to the display panel through the contact of the inspecting device. The vision camera 142 may image the display panel and detect (e.g., obtain) the second inspection image IMG_T2 when the first data voltage and the second common voltage are provided to the display panel through the contact of the inspecting device. The vision camera 142 may image the display panel and detect (e.g., obtain) the third inspection image IMG_T3 when the second data voltage and the first common voltage are provided to the display panel through the contact of the inspecting device.

The first defect detector 144 may detect the position and the luminance of the contact noise based on the first inspection image IMG_T1 and the second inspection image IMG_T2, generate the compensation data Cdata that compensates for the contact noise of the first inspection image IMG_T1, and output the compensation data Cdata to the signal generator. The first inspection image IMG_T1 may include the defect of the display panel (e.g., the line defect) and the contact noise. The first defect detector 144 may store the position and the luminance of the defect of the display panel and the contact noise in the first inspection image IMG_T1. The second inspection image IMG_T2 may include the defect of the display panel. The first defect detector 144 may store the position and the luminance of the contact noise in the first inspection image IMG_T1 by comparing the second inspection image IMG_T2 to the first inspection image IMG_T1. The first defect detector 144 may generate the compensation data Cdata that compensates the luminance of the contact noise in the first inspection image IMG_T1. For example, when the luminance of the position where the contact noise is generated is higher than the peripheral luminance in the first inspection image IMG_T1, the first defect detector 144 may generate the compensation data Cdata that lowers the luminance at the position where the contact noise occurs. The first defect detector 144 may provide the compensation data Cdata to the signal generator.

The second defect detector 146 may detect the defect of the display panel based on the third inspection image IMG_T3. The third inspection image IMG_T3 may be the image in which the contact noise is removed. That is, the third inspection image IMG_T3 may include the defects (e.g., the line defect, the pixel defect, the stain defect, etc.) of the display panel except (e.g., without) the contact noise due to the contact failure of the contact of the inspecting device. The second defect detector 146 may detect the defect of the display panel based on the third inspection image IMG_T3.

As described above, the defect detector 140 of the inspecting device for the display panel may image the first inspection image IMG_T1, the second inspection image IMG_T2, and the third inspection image IMG_T3, generate the compensation data Cdata that compensates for the contact noise based on the first inspection image IMG_T1 and the second inspection image IMG_T2, and detect the defect DEFECT of the display panel based on the third inspection image IMG_T3. Thus, the defect DEFECT of the display panel may be accurately detected.

Figure 7:
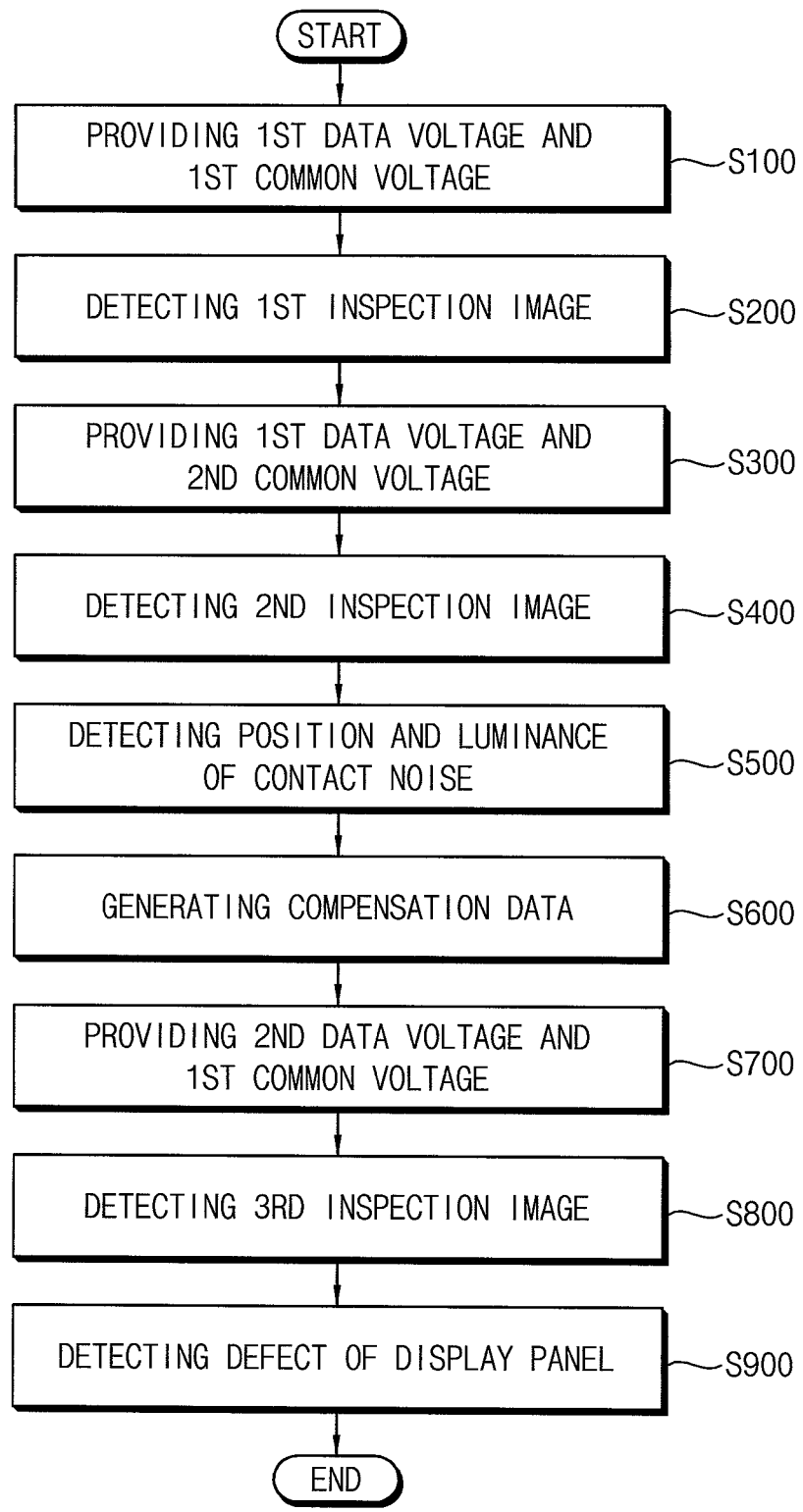
FIG. 7 is a flow chart illustrating an inspecting method for a display panel according to example embodiments.

FIG. 7 is a flow chart illustrating an inspecting method for a display panel according to example embodiments.

Referring to FIG. 7, an inspecting method for a display panel may include an operation of providing a first data voltage and a first common voltage to the display panel S100, an operation of detecting a first inspection image S200, an operation of providing the first data voltage and a second common voltage to the display panel S300, an operation of detecting a second inspection image S400, an operation of detecting a position and luminance of the contact noise S500, an operation of generating a compensation data S600, an operation of providing a second data voltage and the first common voltage to the display panel S700, an operation of detecting a third inspection image S800, and an operation of detecting a defect of the display panel S900.

The inspecting method for the display panel may provide the first data voltage and the first common voltage to the display panel in operation S100. Data pads coupled to data lines and common voltage pads coupled to common voltage lines may be formed in a non-display area of the display panel. The inspecting method for the display panel may provide the first data voltage corresponding to a first gray level to the data pads through first probe pins and provide the first common voltage to the common voltage pads through second probe pins. In some example embodiments, when the display panel is a normal black panel, the first gray level may be the maximum gray level value. In other example embodiments, when the display panel is a normal white panel, the first gray level may be the minimum gray level value. The first data voltage may swing between a first voltage level and a second voltage level lower than the first voltage level. The first common voltage may be a voltage level between the first voltage level and the second voltage level.

The inspecting method for the display panel may image the display panel and detect (e.g., obtain) the first inspection image in operation S200. When short circuit occurs between the common voltage line and the data line (i.e., when a potential difference between the common voltage line and the data line does not occur) due to the contact failure of the first probe pins and the second probe, the contact noise having the same shape of the line defect of the display panel may occur. The first inspection image may include the defect of the display panel and the contact noise.

The inspecting method for the display panel may provide the first data voltage and the second common voltage to the display panel in operation S300. The inspecting method for the display panel may provide the first data voltage corresponding to the first gray level to the data pads through the first probe pins and provide the second common voltage to the common voltage pads through the second probe pins. The first data voltage may swing between the first voltage level and the second voltage level lower than the first voltage level. The second common voltage may be a voltage level higher than the first voltage level.

The inspecting method for the display panel may image the display panel and detect (e.g., obtain) the second inspection image in operation S400. Here, the contact noise may not occur even if the contact failure of the first probe pins and the second probe pins occurs because there is a potential difference between the second common voltage provided to the common voltage line and the first data voltage provided to the data line. Thus, the second inspection image may include the defect of the display panel excluding (e.g., without) the contact noise.

The inspecting method for the display panel may detect the position and the luminance of the contact noise based on the first inspection image and the second inspection image in operation S500. The inspecting method for the display panel may detect the position and the luminance of the contact noise in the first inspection image by comparing the first inspection image and the second inspection image because the first inspection image may include the defect of the display panel and the contact noise and the second inspection image may include (e.g., only include) the defect of the display panel.

The inspecting method for the display panel may generate the compensation data that compensates the luminance of the contact noise in operation S600. The inspecting method for the display panel may generate the compensation data that compensates the luminance of the contact noise when the luminance of the contact noise in the first inspection image is higher or lower than the peripheral luminance.

The inspecting method for the display panel may provide the second data voltage and the first common voltage to the display panel in operation S700. The inspecting method for the display panel may generate the second data voltage corresponding to the second gray level based on the compensation data. The inspecting method for the display panel may provide the second data voltage corresponding to the second gray level to the data pads through the first probe pins and provide the first common voltage to the common voltage pads through the second probe pins. In some example embodiments, when the display panel is the normal black panel, the first gray level may be a maximum gray level value and the second gray level may have a gray level value lower than the gray level value of the first gray level. In other example embodiments, when the display panel is the normal white panel, the first gray level may be a minimum gray level value and the second gray level may have a gray level value higher than the gray level value of the first gray level. When the second data voltage corresponding to the second gray level is provided to the display panel, a gray color image may be displayed on the display panel. The second data voltage may swing between a third voltage level lower than the first voltage level and a fourth voltage level higher than the second voltage level.

The inspecting method for the display panel may image the display panel and detect (e.g., obtain) the third inspection image in operation S800. The third inspection image may include the defect of the display panel although the short circuit of the common voltage line and the data line due to the contact failure of the first probe pins and the second probe pins may occur because the second data voltage is generated based on the compensation data that compensates for the contact noise.

The inspecting method for the display panel may detect the defect of the display panel based on the third inspection image in operation S900. The inspecting method for the display panel may detect the defect of the display panel (e.g., the line defect, the pixel defect, the stain defect, etc.) based on the third inspection image in which the contact noise are removed.

As described above, the inspecting method for the display panel may generate the compensation data that compensates for the contact noise based on the first inspection image and the second inspection image by changing the voltage level of the common voltage, and detect the defect of the display panel based on the third inspection image to which the contact noise is compensated. Thus, the defect of the display panel may be accurately detected.

The present inventive concept may be applied to a display device and/or an electronic device having (e.g., including) the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

The inspecting device for a display panel and/or any other relevant devices or components according to embodiments of the present invention described herein may be implemented utilizing any suitable hardware, firmware (e.g. an application-specific integrated circuit), software, or a combination of software, firmware, and hardware. For example, the various components of the inspecting device for a display panel may be formed on one integrated circuit (IC) chip or on separate IC chips. Further, the various components of the inspecting device for a display panel may be implemented on a flexible printed circuit film, a tape carrier package (TCP), a printed circuit board (PCB), or formed on one substrate. Further, the various components of the inspecting device for a display panel may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of example embodiments and is not to be construed as limiting thereof. Although example embodiments have been described, those skilled in the art will readily appreciate that many suitable modifications are possible in the example embodiments without materially departing from the novel teachings and enhancements of the present inventive concept. Accordingly, all such modifications are intended to be included within the scope of the present inventive concept as defined in the claims, and equivalents thereof. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

What is claimed is:

1. An inspecting device for a display panel comprising:
   a contact comprising first probe pins configured to contact data pads of the display panel and second probe pins configured to contact common voltage pads of the display panel;
   a signal generator coupled to the first probe pins, the signal generator configured to generate a first data voltage corresponding to a first gray level and a second data voltage corresponding to a second gray level;
   a power generator coupled to the second probe pins, the power generator configured to generate a first common voltage and a second common voltage of which its voltage level is different from that of the first common voltage; and
   a defect detector configured to detect a defect of the display panel by removing a contact noise generated due to contact failure of the first probe pins and the second probe pins.

2. An inspecting device for a display panel comprising:
   a contact comprising first probe pins configured to contact data pads of the display panel and second probe pins configured to contact common voltage pads of the display panel;
   a signal generator coupled to the first probe pins, the signal generator configured to generate a first data voltage corresponding to a first gray level and a second data voltage corresponding to a second gray level;
   a power generator coupled to the second probe pins, the power generator configured to generate a first common voltage and a second common voltage of which its voltage level is different from that of the first common voltage; and
   a defect detector configured to detect a defect of the display panel by removing a contact noise generated due to contact failure of the first probe pins and the second probe pins,
   wherein the defect detector is configured to detect the defect of the display panel based on a first inspection image detected when the first data voltage and the first common voltage are provided to the display panel through the contact, a second inspection image detected when the first data voltage and the second common voltage are provided to the display panel through the contact, and a third inspection image detected when the second data voltage and the first common voltage are provided to the display panel through the contact.

3. The inspecting device of claim 2, wherein the first inspection image comprises the defect of the display panel and the contact noise, and the second inspection image comprises the defect of the display panel without the contact noise.

4. The inspecting device of claim 2, wherein the defect detector is configured to detect positions and luminance of the defect of the display panel and the contact noise based on the first inspection image, and detect the position of the defect of the display panel based on the second inspection image.

5. The inspecting device of claim 2, wherein the defect detector is configured to detect a position and luminance of the contact noise comprised in the first inspection image based on the first inspection image and the second inspection image, and generate a compensation data configured to compensate for the contact noise.

6. The inspecting device of claim 5, wherein the detection detector is configured to provide the compensation data to the signal generator, and
   wherein the signal generator is configured to generate the second data voltage corresponding to the second gray level based on the compensation data.

7. The inspecting device of claim 2, wherein the defect detector is configured to detect the defect of the display panel based on the third inspection image.

8. The inspecting device of claim 2, wherein the defect detector comprises:
   a vision camera configured to image the display panel and obtain the first inspection image, the second inspection image, and the third inspection image;
   a first defect detector configured to detect a position and luminance of the contact noise based on the first inspection image and the second inspection image, generate a compensation data configured to compensate for the contact noise, and output the compensation data to the signal generator; and a second defect detector configured to detect the defect of the display panel based on the third inspection image.

9. The inspecting device of claim 1, wherein the first data voltage is configured to swing between a first voltage level and a second voltage level lower than the first voltage level,
the first common voltage is a voltage level between the first voltage level and the second voltage level, and
the second common voltage is higher in voltage level than the first voltage level.

10. The inspecting device of claim 9, wherein a difference of the voltage level of the second common voltage and the first voltage level of the first data voltage is greater than or the same as a difference of the first voltage level of the first data voltage and the voltage level of the first common voltage.

11. The inspecting device of claim 1, wherein the display panel is a normal black panel, and the first gray level is a maximum gray level value and the second gray level has a gray level value lower than the gray level value of the first gray level.

12. The inspecting device of claim 1, wherein the display panel is a normal white panel, and the first gray level is a minimum gray level value and the second gray level has a gray level value higher than the gray level value of the first gray level.

13. An inspecting method for a display panel, the method comprising:
providing a first data voltage corresponding to a first gray level to data pads of the display panel through first probe pins and providing a first common voltage to common voltage pads of the display panel through second probe pins;
obtaining a first inspection image by imaging the display panel;
providing the first data voltage to the data pads through the first probe pins and providing a second common voltage of which its voltage level is different than that of the first common voltage to the common voltage pads through the second probe pins;
obtaining a second inspection image by imaging the display panel;
detecting a position and luminance of a contact noise generated due to a contact failure of the first probe pins and the second probe pins based on the first inspection image and the second inspection image;
generating a compensation data configured to compensate the luminance of the contact noise;
providing a second data voltage corresponding to a second gray level to the data pads through the first probe pins and providing the first common voltage to the common voltage pads through the second probe pins, wherein the second data voltage is generated based on the compensation data;
obtaining a third inspection image by imaging the display panel; and
detecting a defect of the display panel based on the third inspection image.

14. The inspecting method of claim 13, wherein the first data voltage is configured to swing between a first voltage level and a second voltage level lower than the first voltage level.

15. The inspecting method of claim 14, wherein the first common voltage is a voltage level between the first voltage level and the second voltage level.

16. The inspecting method of claim 15, wherein the second common voltage is higher in voltage level than the first voltage level.

17. The inspecting method of claim 16, wherein a difference between the voltage level of the second common voltage and the first voltage level of the first data voltage is greater than or the same as a difference between the first voltage level of the first data voltage and the voltage level of the first common voltage.

18. The inspecting method of claim 13, wherein the display panel is a normal black panel, the first gray level is a maximum gray level value and the second gray level has a gray level value lower than the gray level value of the first gray level.

19. The inspecting method of claim 13, wherein the display panel is a normal white panel, the first gray level is a minimum gray level value and the second gray level has a gray level value higher than the gray level value of the first gray level.

20. The inspecting method of claim 13, wherein the first inspection image comprises the defect of the display panel and the contact noise, and the second inspection image comprises the defect of the display panel without the contact noise.

* * * * *